US008817913B2

(12) United States Patent
Hinson

(10) Patent No.: US 8,817,913 B2
(45) Date of Patent: Aug. 26, 2014

(54) DIGITAL FILTER-DECIMATOR-TUNER

(75) Inventor: Jerry R. Hinson, Mountain View, CA (US)

(73) Assignee: Raytheon Applied Signal Technology, Inc., Sunnyvale, CA (US)

( * ) Notice: Subject to any disclaimer, the term of this patent is extended or adjusted under 35 U.S.C. 154(b) by 861 days.

(21) Appl. No.: 12/772,105

(22) Filed: Apr. 30, 2010

(65) Prior Publication Data
US 2011/0267130 A1 Nov. 3, 2011

(51) Int. Cl.
*H03K 9/00* (2006.01)
*H03K 5/01* (2006.01)

(52) U.S. Cl.
USPC ............ 375/316; 375/340; 375/346; 375/350

(58) Field of Classification Search
USPC ......... 375/229–236, 285, 295, 316, 346–350, 375/254, 219–222, 240.26–240.29, 340, 375/324
See application file for complete search history.

(56) References Cited

U.S. PATENT DOCUMENTS

| | | | |
|---|---|---|---|
| 5,732,337 A | 3/1998 | Wargnier et al. | |
| 5,949,878 A * | 9/1999 | Burdge et al. | 380/276 |
| 6,272,226 B1 * | 8/2001 | Khan et al. | 381/4 |
| 6,667,760 B1 | 12/2003 | Limberg | |
| 6,724,832 B1 * | 4/2004 | Hershberger | 375/301 |
| 6,907,083 B2 | 6/2005 | Lillington | |
| 8,019,290 B2 * | 9/2011 | Mak et al. | 455/91 |
| 2007/0116098 A1 * | 5/2007 | Valio et al. | 375/147 |
| 2009/0168924 A1 * | 7/2009 | Gomez et al. | 375/340 |

OTHER PUBLICATIONS

Oppenheim et al, Discrete Time Signal Processing 2nd Edition,1999,1989, Prentice-Hall, Inc, pp. 486-488,491,503-505.*
Lillington, John, RF Engines Limited White Paper, "The Pipelined Frequency Transform (PFT) (PFR architecture and comparisons with FFT / digital down-converter techniques)", Reference No. PFT 001. Rev2, RFEL, pp. 1-14, Last Updated Feb. 20, 2002.
Written Opinion of the International Searching Authority for International Application No. PCT/US2011/034606, filed Apr. 29, 2011, Written Opinion of the International Searching Authority mailed Aug. 17, 2011 (4 pgs.).
International Search Report for International Application No. PCT/US2011/034606, filed Apr. 29, 2011, International Search Report dated Aug. 3, 2011 and mailed Aug. 17, 2011 (2 pgs.).

* cited by examiner

*Primary Examiner* — Sam K Ahn
*Assistant Examiner* — Linda Wong
(74) *Attorney, Agent, or Firm* — Christie, Parker & Hale, LLP

(57) ABSTRACT

A digital filter-decimator-tuner is configured to receive a complex signal input $x_k$ and output a complex USB signal $yu_k$ and a complex LSB signal $yl_k$. It includes a USB processing path coupled to receive $x_k$ and output $yu_k$, the USB processing path including a USB FIR filter configured to receive a portion of the $x_k$ signal and output a first USB intermediate filtered signal, a decimator configured to decimate the first USB intermediate filtered signal and output a second USB intermediate signal, a USB tuner configured to receive the second USB intermediate signal and a USB tuning signal and output a third USB intermediate signal, and a USB equalization filter configured to receive the third USB intermediate signal, and output $yu_k$; and a parallel LSB processing path coupled to receive $x_k$ and output $yl_k$. The USB and LSB processing paths may be implemented by the same hardware in one embodiment.

23 Claims, 4 Drawing Sheets

US 8,817,913 B2

DIGITAL FILTER-DECIMATOR-TUNER

TECHNICAL FIELD

The present disclosure is directed generally to the field of digital signal processing. More particularly, it is directed to a tuner for separating a digitally sampled input signal into upper and lower sideband signals suitable for further processing.

BACKGROUND

FIG. 1 illustrates a prior art implementation 10 of a tuner-filter-decimator which is a conventional technique for separating a complex input signal into upper sideband and lower sideband complex signals.

The complex digitally sampled signal of interest (SOI) to be processed (referred to as $x_k$) has an input bandwidth at a sample rate of $F_s$ of, e.g., $-F_s/4$ to $+F_s/4$. One half of the samples are processed by an upper sideband (USB) portion of the processing circuitry (see, e.g., the upper portion of the circuit illustrated in FIG. 1) and the other half of the samples are processed by a lower sideband (LSB) portion of the processing circuitry (see, e.g., the lower portion of the circuit illustrated in FIG. 1). In FIG. 1, a USB tuner formed by multiplier 12 tunes the input signal $x_k$ on line 14 down by frequency $-F_s/8$ by multiplying input signal $x_k$ on line 14 by the sequence $S_k = e^{-j2\pi k/8}$ for k=0, 1, 2, 3, . . . to generate a complex signal on line 18 centered on an upper sideband center frequency. In a similar manner, an LSB tuner formed by multiplier 20 tunes the input signal $x_k$ on line 14 up by frequency $+F_s/8$ by multiplying input signal $x_k$ on line 14 by the sequence $S'_k = e^{+j2\pi k/8}$ for k=0, 1, 2, 3, . . . on line 22 to generate a complex signal on line 24 centered on the lower sideband center frequency. A low pass Finite Impulse Response (FIR) filter 26 (in this case of length 13) filters the USB signal on line 18 and produces a filtered USB signal on line 28 which has been sufficiently filtered of the LSB signal and other out-of-band signal components to support the decimation process that follows. Similarly, a low pass FIR filter 30 (also of length 13 in this example) filters the LSB signal on line 24 and produces a filtered LSB signal on line 32 which has been sufficiently filtered of the USB signal and other out-of-band signal components to support the decimation process that follows. A decimator 34 accepts the filtered USB signal on line 28 and discards every other sample, thereby decimating the signal by a factor of 2 to produce tuned, filtered and decimated USB complex signal $yu_k$ on line 36. Likewise, a decimator 38 accepts the filtered LSB signal on line 32 and discards every other sample, thereby decimating the signal by a factor of 2 to produce tuned, filtered and decimated USB complex signal $yl_k$ on line 40.

The implementation of the prior art digital tuner-filter-decimator in FIG. 1 requires 26 memory storage registers and 26 multipliers to implement the two length 13 low pass FIR filters 26, 30. Further increasing the complexity of the implementation, the tuner-filter-decimator 10 of FIG. 1 requires complicated multipliers 12, 20 for the tuners that are each capable of multiplying by non-trivial values such as $\sqrt{2}(=1.4142135\ldots)$ rather than trivial values such as +1 and −1. A simpler implementation would be desirable, particular for use with multi-channel receivers.

OVERVIEW

A digital filter-decimator-tuner is configured to receive a complex signal input $x_k$ and output a complex USB signal $yu_k$ and a complex LSB signal $yl_k$. It includes a USB processing path coupled to receive $x_k$ and output $yu_k$ the USB processing path including a USB FIR filter configured to receive the $x_k$ signal and output a first USB intermediate filtered signal, a decimator configured to decimate the first USB intermediate filtered signal and output a second USB intermediate signal, a USB tuner configured to receive the second USB intermediate signal and a USB tuning signal and output a third USB intermediate signal, and an optional USB equalization filter configured to receive the third USB intermediate signal, and output $yu_k$; and a parallel LSB processing path coupled to receive $x_k$ and output $yl_k$. The USB and LSB FIR filters may be implemented by the same hardware in one embodiment.

The digital filter-decimator-tuner in accordance with the present invention provides an especially efficient mechanism for separating digitally sampled signals into USB and LSB signals. The digital filter-decimator-tuner improves over the conventional digital tuner-filter-decimator illustrated in FIG. 1 that performs the operations: 1) tuning by selected frequencies (e.g., $+F_s/8$ and $-F_s/8$), where $F_s$ is the sampling rate; 2) low pass filtering using a symmetric FIR filter; and 3) output sample decimation by a factor of two. The digital filter-decimator-tuner rearranges the order of filtering and tuning with respect to the conventional digital tuner-filter-decimator of FIG. 1 and exploits other DSP techniques thereby providing an especially efficient and well suited architecture for hardware implementations in Field Programmable Gate Arrays (FPGAs) or Application Specific Integrated Circuits (ASICs). In one embodiment the number of memory storage registers and multipliers utilized is significantly reduced, thereby supporting efficient time-multiplexed implementations while providing better than 78 dB of anti-alias filtering rejection.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Figure 1:
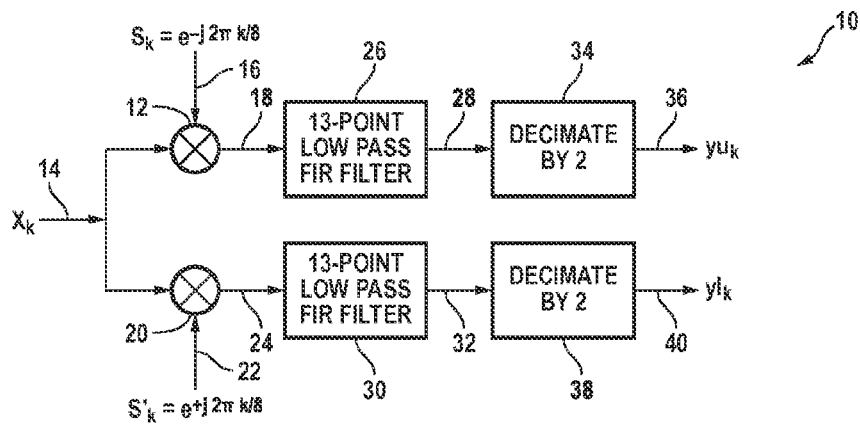
FIG. 1 is a schematic block diagram of a digital tuner-filter-decimator in accordance with the prior art.

Example embodiments are described herein in the context of methods and circuitry useable in a communications receiver. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, FPGAs, ASICs, or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

In accordance with embodiments of the present invention, methods and apparati are provided to accomplish efficient implementation of a filter-decimator-tuner configured to separate a complex digitally sampled signal into USB and LSB digital complex signals suitable for further processing. The filter-decimator-tuner of the present invention is suitable for hardware implementations in FPGAs or ASICs but may also be implemented as software or firmware executable by a programmable device.

Figure 2:
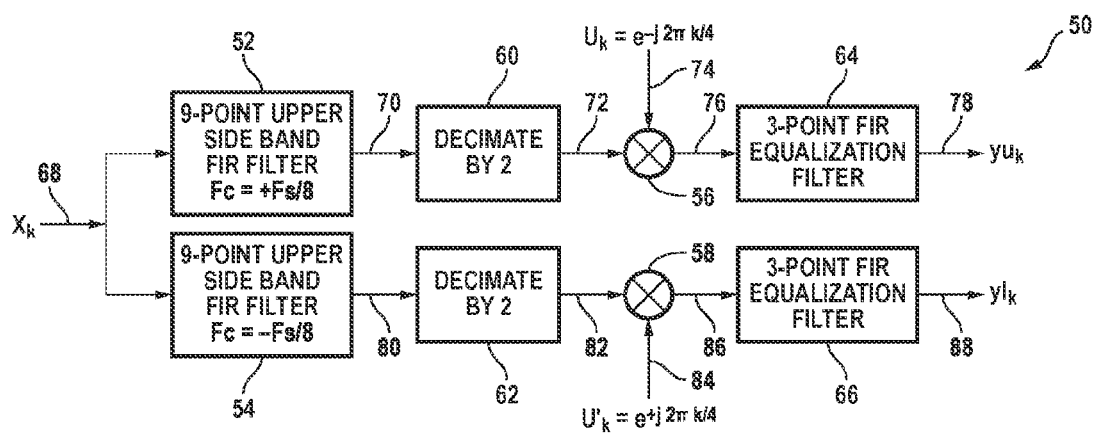
FIG. 2 is a schematic block diagram of a digital filter-decimator-tuner in accordance with an embodiment of the present invention.

FIG. 2 is a top level schematic block diagram for an embodiment 50 of the present invention. FIG. 2 illustrates an efficient approach for separating a complex digitally sampled input signal into USB and LSB complex digital signals. Although FIG. 2 illustrates a specific implementation using 9-point side band filters located before the decimator and tuner sections and 3-point equalization filters located after the decimator and tuner sections, the present invention is not intended to be so limited and may be extended to longer or shorter filter lengths as deemed suitable by the designer. Additionally, there is no requirement that the filtering be split into two sections.

The embodiment illustrated in FIG. 2 achieves an efficient implementation by employing USB and LSB filters 52, 54 that are, in this example, tuned to the upper and lower sideband center frequencies $+F_s/8$ and $-F_s/8$, respectively, and by moving the location of tuning multipliers 56, 58 (with respect to the FIG. 1 implementation) to a position after the decimation blocks 60, 62. With this new approach, the implementation requirement for the multipliers 56, 58 is simplified as only trivial multiplications by +1, +j, -1, and -j are required.

The embodiment illustrated in FIG. 2 achieves further efficiency by splitting the filtering function into two parts: 1) pre-decimation upper and lower sideband filters 52, 54 containing only stop band zeros; and 2) post-decimation equalization filters 64, 66 to flatten the pass band response. Then, rather than implementing separate USB and LSB filters 52, 54 as depicted in FIG. 2, an embodiment of the present invention implements a single filter which has partial sum outputs. The implementation details for the filter with partial sum outputs are described below in equations and in the discussion regarding FIG. 3. An embodiment of the present invention combines the partial sum outputs in two different ways to produce the desired USB and LSB signals while requiring significantly less hardware.

As in the FIG. 1 implementation, the input digital sampled signal $x_k$ has a sample rate of $F_s$ and a bandwidth of, e.g., $-F_s/4$ to $+F_s/4$. Samples are fed to the USB and LSB portions of the processor. In the USB (upper) portion of FIG. 2, a USB FIR filter 52 (in this case of length 9) filters the input signal $x_k$ on line 68 and produces a filtered USB signal on line 70 which has been sufficiently filtered of the LSB signal and other out-of-band signal components to support the decimation process that follows. A decimator 60 accepts the filtered USB signal on line 70 and discards every other sample, thereby decimating the signal by a factor of 2 to produce a filtered, decimated complex USB signal on line 72. A tuner implemented by multiplier 56 tunes the complex signal on line 70 down by frequency $-F_s/4$ by multiplying the complex signal on line 72 by the sequence $u_k = e^{-j2\pi k/4}$ for $k=0, 1, 2, 3, \ldots$ (k an integer) on line 74 to generate a tuned USB complex signal on line 76 centered on the USB center frequency. An equalization FIR filter 64 filters and equalizes the pass band of the complex signal on line 76 to produce the output USB complex signal $yu_k$ on line 78.

Similarly in the LSB (lower) portion of FIG. 2, an LSB FIR filter 54 (also of length 9) filters the input signal $x_k$ on line 64 and produces a filtered LSB signal on line 80 which has been sufficiently filtered of the USB signal and other out-of-band signal components to support the decimation process that follows. A decimator 62 accepts the filtered LSB signal on line 80 and discards every other sample thereby decimating the signal by a factor of 2 to produce the filtered, decimated complex LSB signal on line 82. A tuner implemented by multiplier 58 tunes the complex signal on line 82 up by frequency $+F_s/4$ by multiplying the complex signal on line 82 by the sequence $u'_k = e^{+j2\pi k/4}$ for $k=0, 1, 2, 3, \ldots$ (k an integer) on line 84 to generate a tuned LSB complex signal on line 86 centered on the LSB center frequency. An equalization FIR filter 66 filters and equalizes the pass band of the complex signal on line 86 to produce the output LSB complex signal $yl_k$ on line 88.

Table 1 is a table of 13-point FIR filter coefficient values for use with the FIR filters in FIG. 1:

TABLE 1

| 13-point FIR Filter Coefficients | |
| --- | --- |
| Designator | Value |
| $h_0$ | −0.003884174 |
| $h_1$ | −0.022538948 |
| $h_2$ | −0.048875852 |

TABLE 1-continued 13-point FIR Filter Coefficients

| Designator | Value |
| --- | --- |
| $h_3$ | −0.027214581 |
| $h_4$ | 0.100079126 |
| $h_5$ | 0.284734047 |
| $h_6$ | 0.375400762 |
| $h_7$ | 0.284734047 |
| $h_8$ | 0.100079126 |
| $h_9$ | −0.027214581 |
| $h_{10}$ | −0.048875852 |
| $h_{11}$ | −0.022538948 |
| $h_{12}$ | −0.003884174 |

Table 2 is a table of 9-point FIR filter coefficient values for use with the sideband FIR filters of FIG. 2:

TABLE 2

9-point FIR Filter Coefficients

| Designator | Value |
| --- | --- |
| $f_0$ | 89.1 |
| $f_1$ | 517 |
| $f_2$ | 1455.2 |
| $f_3$ | 2563 |
| $f_4$ | 3072.4 |
| $f_5$ | 2563 |
| $f_6$ | 1455.2 |
| $f_7$ | 517 |
| $f_8$ | 89.1 |

Table 3 is a table of 3-point equalizer FIR filter coefficient values for use with the FIR equalization filter of FIG. 2:

TABLE 3

Equalizer FIR Filter Coefficients

| Designator | Value |
| --- | --- |
| $g_0$ | −¼ = −0.25 |
| $g_1$ | 0 |
| $g_2$ | 1¹⁵/₁₆ = 0.9375 |
| $g_3$ | 0 |
| $g_4$ | −¼ = −0.25 |

Figure 3:
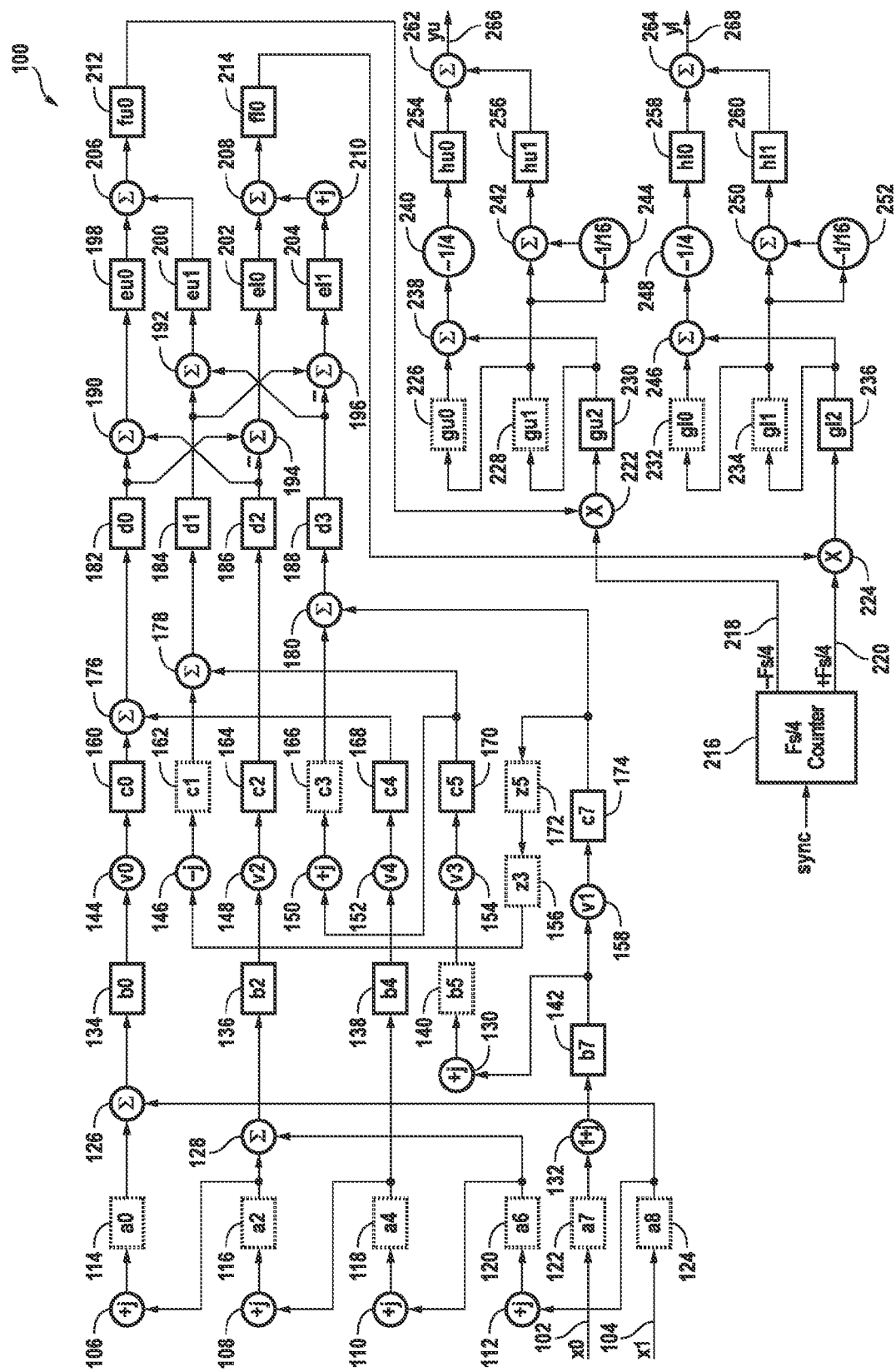
FIG. 3 is a schematic block diagram of a digital filter-decimator-tuner in accordance with an embodiment of the present invention.

Table 4 is a table of filter multiplier values as applied to the embodiment illustrated in FIG. 3:

TABLE 4

Multiplier

| Designator | Value |
| --- | --- |
| $h_0$ | 126 |
| $h_1$ | 517 |
| $h_2$ | 2058 |
| $h_3$ | 2563 |
| $h_4$ | 4345 |
| $h_5$ | 2563 |
| $h_6$ | 2058 |
| $h_7$ | 517 |
| $h_8$ | 126 |

The coefficients $h_i$ (Table 1) for the 13-point low pass filter 26 illustrated in FIG. 1 may be synthesized by the discrete convolution of the coefficients $f_i$ and $g_i$ of two shorter filters, where one filter $f_i$ has zeros only in the stop band and the other filter $g_i$ has zeros only in the pass band. The following equation (EQ. 1) gives this calculation for the discrete convolution:

$$h_i = \sum_{n=-\infty}^{+\infty} f_{i-n} g_i$$

Figure 4:
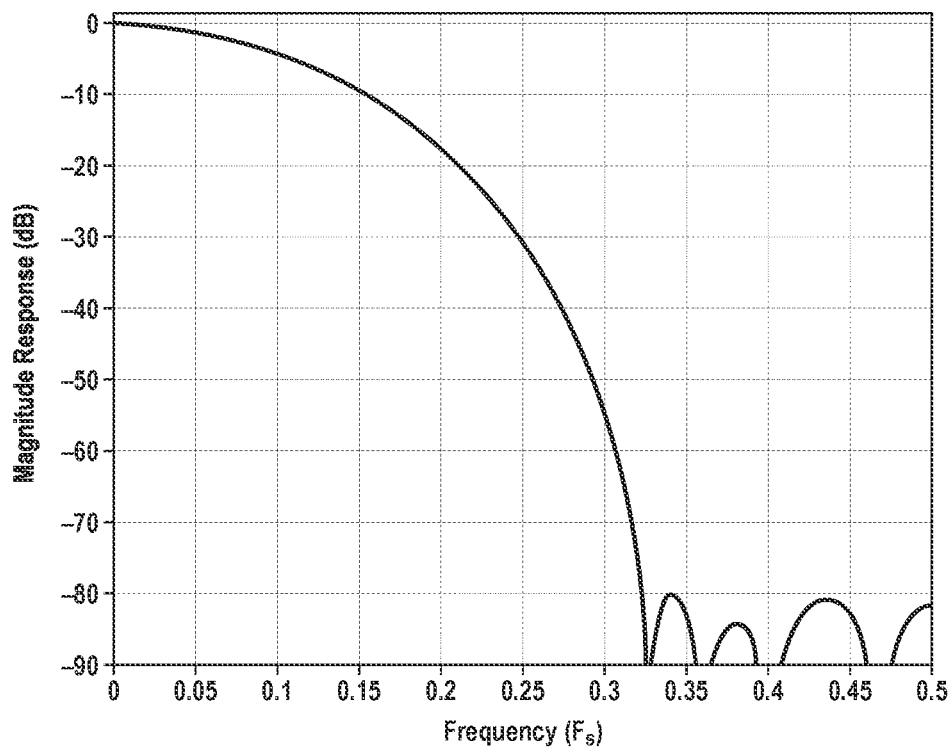
FIG. 4 is a graph of filter magnitude response in db vs. the sampling frequency used for the 9-point low pass filter having zeros only in the stop band.
Figure 5:
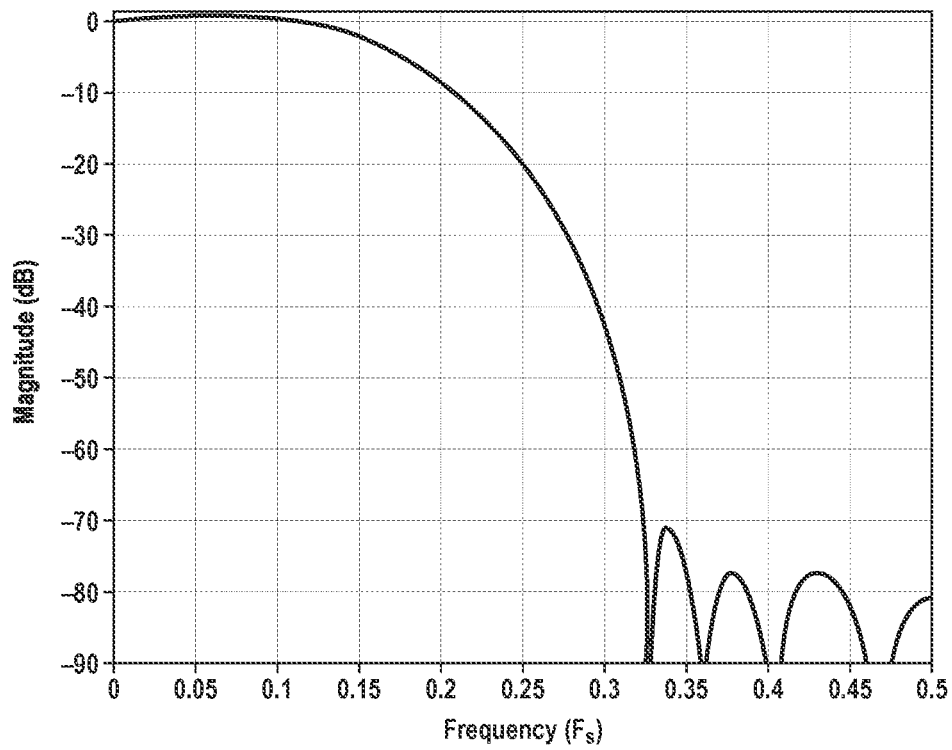
FIG. 5 is a graph of the filter magnitude response in db vs. the sampling frequency used for the equalized 9-point low pass filter for the upper and lower sideband filters.
Figure 6:
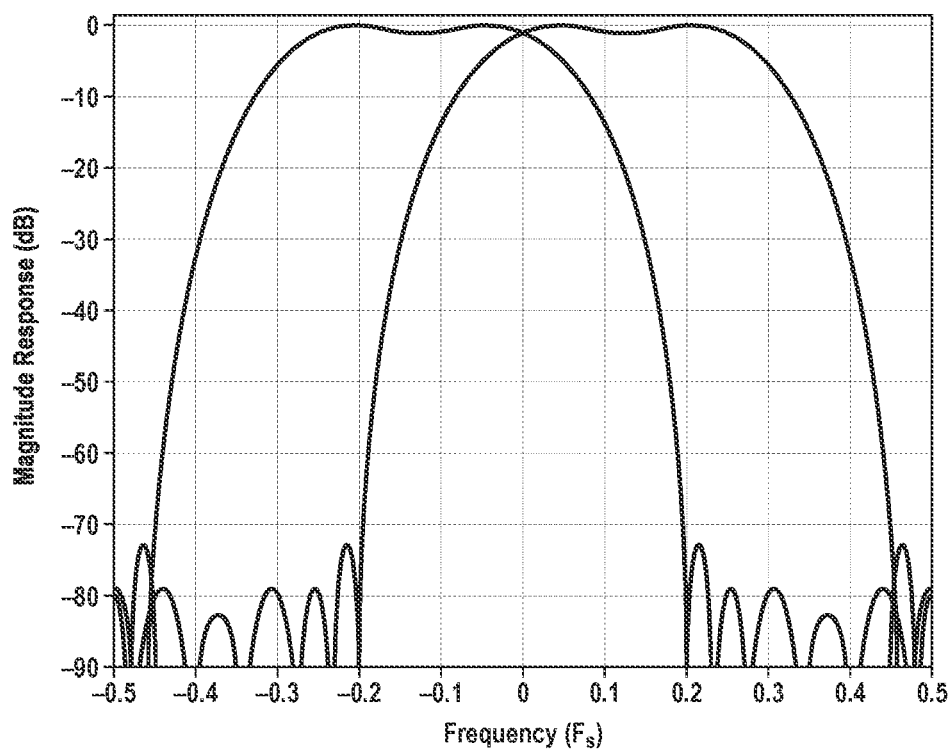
FIG. 6 is a graph of the filter magnitude response in db vs. the sampling frequency for the USB and LSB filters of the digital filter-decimator-tuner in accordance with an embodiment of the present invention.

As a particular example, using the values of $f_i$ and $g_i$ given in Tables 2 and 3, respectively, the discrete convolution of $f_i$ and $g_i$ generates the values $h_i$ given in Table 4. FIG. 4 is a graph of the magnitude response (db) vs. the sampling frequency, $F_s$, for the low-pass 9-point filter coefficients $f_i$ given in Table 2. FIG. 5 is a graph of the magnitude response (db) vs. the sampling frequency, $F_s$, for the low-pass 13-point filter coefficients $h_i$ given in Table 1. The response illustrated in FIG. 5 represents an equalized response by the filter with the coefficients $g_i$ for the response illustrated in FIG. 4. FIG. 6 is a graph of the overall magnitude response (db) vs. the sampling frequency, $F_s$, for the filter-decimator-tuner of FIGS. 2 and 3, representing the response illustrated in FIG. 5 tuned up and down by frequencies $+F_s/8$ and $-F_s/8$.

As indicated above, an embodiment of the present invention implements the upper and lower sideband filters 52, 54 of FIG. 2 as a single filter with partial sum outputs in order to achieve additional implementation efficiency. The following equations define a way for combining partial sums to produce the two filter outputs representing the signals from upper and lower sideband filters.

Defining of the complex operator as $W_k = e^{+j2\pi k/8}$, the equations (EQ. 2, EQ. 3) for computing the conventional implementations for upper and lower sideband FIR filters of length 9 are given by:

$$yu_n = \sum_{k=-4}^{4} x_{n-k} v_k W_k$$

$$yl_n = \sum_{k=-4}^{4} x_{n-k} v_k W_{-k}$$

where $x_{n-k}$ are the complex input signal samples, $v_k$ are the real filter coefficients of the low pass filter prototype, and $yu_n$ and $yl_n$ are the USB and LSB complex output signal samples respectively.

Expanding both of these equations over the summation intervals gives:

$$yu_n = x_{n+4}v_{-4}W_{-4} + x_{n+3}v_{-3}W_{-3} + x_{n+2}v_{-2}W_{-2} + x_{n+1}v_{-1}W_{-1} + x_n v_0 W_0 + x_{n-1}v_1 W_1 + x_{n-2}v_2 W_2 + x_{n-3}v_3 W_3 + x_{n-4}v_4 W_4$$

and $$yl_n = x_{n+4}v_{-4}W_4 + x_{n+3}v_{-3}W_3 + x_{n+2}v_{-2}W_2 + x_{n+1}v_{-1}W_1 + x_n v_0 W_0 + x_{n-1}v_1 W_{-1} + x_{n-2}v_2 W_{-2} + x_{n-3}v_3 W_{-3} + x_{n-4}v_4 W_{-4}$$

Regrouping terms separated by factors of $W_4$ gives:

$$yu_n = x_{n+4}v_{-4}W_{-4} + x_n v_0 W_0 + x_{n-4}v_4 W_4 + x_{n+3}v_{-3}W_{-3} + x_{n-1}v_1 W_1 + x_{n+2}v_{-2}W_{-2} + x_{n-2}v_2 W_2 + x_{n+1}v_{-1}W_{-1} + x_{n-3}v_3 W_3$$

and $$yl_n = x_{n+4}v_{-4}W_4 + x_n v_0 W_0 + x_{n-4}v_4 W_{-4} + x_{n+3}v_{-3}W_3 + x_{n-1}v_1 W_{-1} + x_{n+2}v_{-2}W_2 + x_{n-2}v_2 W_{-2} + x_{n+1}v_{-1}W_1 + x_{n-3}v_3 W_{-3}$$

Defining the following partial sums for the USB and LSB signals, $$du_n = x_{n+4}v_{-4}W_4 + x_n v_0 W_0 + x_{n-4}v_4 W_{-4}$$

$$du_{n-1} = x_{n+3}v_{-3}W_3 + x_{n-1}v_1 W_{-1}$$

$$du_{n-2} = x_{n+2}v_{-2}W_2 + x_{n-2}v_2 W_{-2}$$

$$du_{n-3} = x_{n-1}v_{-1}W_1 + x_{n-3}v_3 W_{-3}$$

and $$dl_n x_{n+4}v_{-4}W_{-4} + x_n v_0 W_0 + x_{n-4}v_4 W_4$$

$$dl_{n-1} = x_{n+3}v_{-3}W_{-3} + x_{n-1}v_1 W_1$$

$$dl_{n-2} = x_{n+2}v_{-2}W_{-2} + x_{n-2}v_2 W_2$$

$$dl_{n-3} = x_{n+1}v_{-1}W_{-1} + x_{n-3}v_3 W_3$$

And noting that $$W_0 = 1, W_2 = j, W_4 = -1, W_6 = -j, W_4 = W_{-4}, W_2 = -W_{-2}$$

and $$W_i = W_{i+8}$$

Then, the LSB partial sums may be rewritten in terms of the USB partial sums, $$dl_n = W_0 du_n = +du_n$$

$$dl_{n-1} = W_2 dl_{n-1} = +j du_{n-1}$$

$$dl_{n-2} = W_4 dl_{n-2} = -du_{n-2}$$

$$dl_{n-3} = W_6 dl_{n-3} = -j du_{n-3}$$

In terms of the partial sums, $du_n$, the USB and LSB filters, $yu_n$ and $yl_n$ are given by:

$$yu_n = du_n + du_{n-1} + du_{n-2} + du_{n-3}$$

and $$yl_n = du_n + j du_{n-1} - du_{n-2} - j du_{n-3}$$

Thus, the USB and LSB filters, $yu_n$ and $yl_n$ signals may be computed from the partial sums from a single filter implementation thereby saving half of the memory storage registers commonly needed in a conventional implementation.

FIG. 3 is a schematic block diagram illustrating one embodiment of the present invention that illustrates: 1) using partial sums to reduce memory storage registers; 2) an approach for implementing a frequency rotation by $e^{-j2\pi/8}$ using multiplication by $1+j$ and post scaling in the alternate filter coefficients by the value $\sqrt{2}$; 3) an approach for saving tap coefficient multiplications by storing and delaying previous calculations; and 4) an approach for computing only decimated filter outputs as opposed to calculating all filter outputs prior to decimation. The embodiment of FIG. 3 includes pipeline registers and, as such, is particularly suited to implementation with a high speed FPGA.

In FIG. 3, all data paths, as indicated by lines with arrows, represent complex data signals that have real and imaginary components. Circle symbols 126, 128, 176, 178, 180, 190, 192, 194, 196, 206, 208, 238, 242, 246, 250, 262 and 264 represent summers. Circle symbols 106, 108, 110, 112, 130, 132, 144, 146, 148, 150, 152, 154, 158, 210, 240, 244, 248 and 252 represent constant multipliers. Circle symbols 222 and 224 represent multipliers where one input has the possible multiplicand values of +1, +j, −1, −j. Rectangle symbol 216 ($F_s$ Counter) is a 2-bit counter whose outputs are the values: +1, +j, −1, −j. Solid rectangle symbols b0 134, b2 136, b4 138, b7 142, c0 160, c2 164, c4 168, c5 170, c7 174, d0 182, d1 184, d2 186, d3 188, eu0 198, eu1 200, el0 202, el1 204, fu0 212, fl0 214, gu2 230, gl2 236, hu0 254, hu1 256, hl0 258 and hl1 260 represent pipelined storage registers. Dashed rectangle symbols a0 114, a2 116, a4 118, a6 120, a7 122, a8 124, b5 140, z3 156, c1 162, c3 166, z5 172, gu0 226, gu1 228, gl0 232 and gl1 234 represent storage registers for a single filter-decimator-tuner implementation. By replacing this last set of storage registers with addressable electronic memory, such as Random Access Memory (RAM), or the like, where each memory has N registers, the architecture shown in FIG. 3 may be used to implement a number, N, of filter-decimator-tuners operating simultaneously in a time-multiplexed manner thus achieving a significant reduction in the hardware requirement.

An embodiment of the invention illustrated in FIG. 3 implements a frequency rotation by $e^{-j2\pi/8}$ using multiplication by $1+j$ for filter coefficients with odd index and post scaling in the even index filter coefficients by $\sqrt{2}$. The filter multiplier coefficients $h_0$, $h_1$, $h_2$, $h_3$ and $h_4$ in Table 4 represent the filter coefficients $f_0$, $f_1$, $f_2$, $f_3$ and $f_4$ from Table 2 where the coefficients with even indexes have been multiplied by $\sqrt{2}$ so that these paths have the correct gain with respect to the odd index signal paths.

In FIG. 3, storage registers a7 122 and a8 124 accept the two complex input data samples, x0 on line 102 and x1 on line 104 which represent two consecutive data samples from the input signal stream $x_k$. Constant multipliers 106, 108, 110, 112, 130, 132, 144, 146, 148, 150, 152, 154, 158, 210, 240, 244, 248 and 252 multiply their input value by the constant value shown inside the symbol. Constant multipliers v0 144, v1 158, v2 148, v3 154, and v4 152 are the adjusted filter coefficients for the 9-point upper and lower sideband filter implementation. The implementation in FIG. 3 requires only 5 of the 9 filter coefficient values since the approach exploits the symmetry of the filter coefficient about the center value. The correct FIR filter input signal for storage register c1 162 is provided by delaying the previously computed signal output of register c7 174 through registers z5 172 and z3 156 and by multiplying by −j in multiplier 146. The correct FIR filter input signal for storage register c3 166 is provided by multiplying the previously computed signal output of register c5 170 by +j in multiplier 146.

Pipelined storage registers 134, 136, 138, 142, 160, 164, 168, 170, 174, 182, 184, 186, 188, 198, 200, 202, 204, 212, 214, 230, 236, 254, 256, 258 and 260 and storage registers 114, 116, 118, 120, 122, 124, 140, 156, 162, 166, 172, 226, 228, 232 and 234 store and delay their input values by one time period. Summers 126, 128, 176, 178, 180, 190, 192, 194, 196, 206, 208, 238, 242, 246, 250, 262 and 264 sum their two input values to produce their respective output values. The calculations computed by pipelined storage registers 182, 184, 186, 188, 198, 200, 202 and 204 and summers 190, 192, 194 and 196 generate the upper and lower sideband filter outputs in pipelined storage registers fu0 212 and fl0 214 from the single filter computation in storage registers 160, 162, 164, 166, 168, 170, 172 and 174.

Multipliers 222 and 224 perform tuning by $+F_s/4$ and $-F_s/4$ by multiplying their inputs (fu0, fl0) by the possible multiplicand values of +1, +j, −1, and −j generated by the counter 216.

Decimation in the FIG. 3 embodiment is carried out by implementing an architecture that produces only one USB signal, yu, on line 266, and only one LSB signal, yl, on line 268, for each pair of consecutive input samples, x0 on line 102 and x1 on line 104, of the input signal stream $x_k$.

Storage registers gu0 226, gu1 228, gu2 230, hu0 254 and hu1 256 with summers 238, 242, and 262 and constant multipliers 240 and 244 implement the equalization FIR filter for the upper sideband signal output yu on line 266. Storage registers gl0 232, gl1 234, gl2 236, hl0 258 and hl1 260 with summers 246, 250, and 264 and constant multipliers 248 and 252 implement the equalization FIR filter for the lower sideband signal output yl on line 268. In the implementation shown in FIG. 3, these values are produced simultaneously.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A digital filter-decimator-tuner configured to receive a complex digitally sampled signal input $x_k$ and output a complex digital USB signal $yu_k$ and a complex digital LSB signal $yl_k$, comprises:
    an upper sideband (USB) processing path coupled to receive $x_k$ and output $yu_k$ based on a tuned USB complex signal, the USB processing path including a first USB finite impulse response (FIR) filter configured to receive the $x_k$ signal and output a filtered USB signal, a decimator configured to decimate the filtered USB signal and output a filtered decimated complex USB signal, a USB tuner configured to receive the filtered decimated complex USB signal and a USB tuning signal and to output the tuned USB complex signal; and
    a lower sideband (LSB) processing path coupled to receive $x_k$ and output $yl_k$ based on a tuned LSB complex signal the LSB processing path including a first LSB FIR filter configured to receive the $x_k$ signal and output a filtered LSB signal, a decimator configured to decimate the filtered LSB signal and output a filtered decimated complex LSB signal, a LSB tuner configured to receive the filtered decimated complex LSB signal and a LSB tuning signal and to output the tuned LSB complex signal.

2. The apparatus of claim 1, further comprising:
    a USB equalization filter configured to receive the tuned USB complex signal and output $yu_k$; and
    a LSB equalization filter configured to receive the tuned LSB complex signal and output $yl_k$.

3. The apparatus of claim 2, wherein the USB equalization filter and the LSB equalization filter are of order m, where m is an integer greater than or equal to one.

4. The apparatus of claim 3, wherein m=3.

5. The apparatus of claim 1, wherein the USB FIR filter and the LSB FIR filter are of order n, where n is an integer greater than or equal to one.

6. The apparatus of claim 5, wherein n=9.

7. The apparatus of claim 1, wherein the USB tuner and the LSB tuner are implemented with multipliers.

8. The apparatus of claim 1, wherein the digital filter-decimator-tuner has a sampling rate Fs, the center frequency of the filtered USB signal is +Fs/8, and the center frequency of the filtered LSB signal is −Fs/8.

9. The apparatus of claim 1, wherein the USB decimator and the USB decimator both decimate by a factor of two.

10. The apparatus of claim 1, wherein the USB tuning signal is $u_k=e^{-j2\pi k/4} u_k=e^{-j2\pi k/4}$ and the LSB tuning signal is $u'_k=e^{+j2\pi k/4}$ wherein k is an integer greater than or equal to zero.

11. The apparatus of claim 1, wherein the USB FIR filter and LSB FIR filter are implemented as a symmetric filter.

12. The apparatus of claim 1, wherein the USB FIR filter and the LSB FIR filter are implemented as a single filter simultaneously processing USB and LSB signals and producing USB and LSB output signals by partial sums manipulation.

13. The apparatus of claim 1, further comprising a second USB FIR filter disposed before the USB tuner and the USB decimator and a second LSB FIR filter disposed before the LSB tuner and the LSB decimator.

14. A digital filter-decimator-tuner configured to receive a complex digitally sampled signal input $x_k$ and output a complex digital USB signal $y_{uk}$ and a complex digital LSB signal $y_{lk}$, comprises:
    an upper sideband (USB) and a lower sideband (LSB) processing path coupled to receive the input $x_k$ signal and output $y_{uk}$ and $y_{lk}$, the USB and LSB processing path including a finite impulse response (FIR) filter configured to receive the input $x_k$ signal and output a filtered USB signal and a filtered LSB signal,
    a USB decimator configured to decimate the filtered USB signal and to output a filtered decimated complex USB signal,
    a LSB decimator configured to decimate the filtered LSB signal and output a filtered decimated complex LSB signal,
    a USB tuner configured to receive the filtered decimated complex USB signal and a USB tuning signal and output a tuned USB complex signal,
    a LSB tuner configured to receive the filtered decimated complex LSB signal and a LSB tuning signal and output a tuned LSB complex signal,
    a USB equalization filter configured to receive the tuned USB complex signal, and to output $y_{uk}$, and a LSB equalization filter configured to receive the tuned LSB complex signal, and output $y_{lk}$.

15. The apparatus of claim 14, wherein the USB tuner and the LSB tuner include multipliers.

16. The apparatus of claim 14, wherein the digital filter-decimator-tuner has a sampling rate Fs, the center frequency of the filtered USB signal is +Fs/8, and the center frequency of the filtered LSB signal is −Fs/8.

17. The apparatus of claim 14, wherein the decimator is configured to decimate by a factor of two.

18. The apparatus of claim 14, wherein the USB tuning signal is $u_k=e^{-j2\pi k/4}$ and the LSB tuning signal is $u'_k=e^{+j2\pi k/4}$ wherein k is an integer greater than or equal to zero.

19. The apparatus of claim 14, wherein the FIR filter is configured as a 9-point digital filter.

20. The apparatus of claim 14, wherein the USB equalization filter is configured as a 3-point digital filter and the LSB equalization filter is configured as a 3-point digital filter.

21. A method for digitally filtering, decimating and tuning a complex digitally sampled input signal $x_k$ to output a complex digital upper sideband (USB) signal $yu_k$, the method comprising:
    using a finite impulse response filter to filter the input signal $x_k$, and output a first USB intermediate filtered signal;
    using a decimator to decimate the first USB intermediate filtered signal and output a second USB intermediate signal;
    using a USB tuner configured to receive as inputs the second USB intermediate signal and a USB tuning signal and output a third USB intermediate signal;
    outputting $yu_k$ in response to the third USB intermediate signal.

22. The method of claim 21, wherein said outputting $yu_k$ includes using a USB equalization filter to equalize the third USB intermediate signal.

23. The method of claim 22, wherein using the USB tuner includes multiplying the inputs to the tuner to form the output of the tuner.

* * * * *